US006881650B2

United States Patent
Lee et al.

(10) Patent No.: US 6,881,650 B2
(45) Date of Patent: Apr. 19, 2005

(54) METHOD FOR FORMING SOI SUBSTRATE

(75) Inventors: Jung-Il Lee, Kimcheon-shi (KR); Kazuyuki Fujihara, Seoul (KR); Nae-In Lee, Seoul (KR); Geum-Jong Bae, Kyunggi-do (KR); Hwa-Sung Rhee, Seoul (KR); Sang-su Kim, Yongin-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 101 days.

(21) Appl. No.: 10/307,351

(22) Filed: Dec. 2, 2002

(65) Prior Publication Data

US 2003/0119280 A1 Jun. 26, 2003

(30) Foreign Application Priority Data

Dec. 3, 2001 (KR) .................................. 10-2001-0075864

(51) Int. Cl.$^7$ .............................................. H01L 21/20
(52) U.S. Cl. .................. 438/481; 438/311; 438/312; 438/341; 438/458
(58) Field of Search ................... 438/767, 778, 438/779, 933, 47, 87, 97, 94, 172, 235, 311, 312, 341, 357, 409, 413, 416, 458, 481, 762, 93

(56) References Cited

U.S. PATENT DOCUMENTS

| | | | |
|---|---|---|---|
| 5,534,713 A | * 7/1996 | Ismail et al. | 257/24 |
| 5,876,497 A | 3/1999 | Atoji | 117/85 |
| 5,906,951 A | 5/1999 | Chu et al. | 438/751 |
| 6,059,895 A | 5/2000 | Chu et al. | 148/33.1 |
| 6,503,778 B1 * | 1/2003 | Yamauchi et al. | 438/107 |
| 6,521,041 B1 * | 2/2003 | Wu et al. | 117/94 |
| 6,677,192 B1 * | 1/2004 | Fitzgerald | 438/172 |
| 6,774,010 B1 * | 8/2004 | Chu et al. | 438/458 |
| 2002/0146892 A1 * | 10/2002 | Notsu et al. | 438/455 |

FOREIGN PATENT DOCUMENTS

JP    12-349267    12/2000

OTHER PUBLICATIONS

Huang et al. "Carrier Mobility Enhancement in Strained Si–On–Insulator, etc.." 2001 Symposium on VLSI Technology Digest of Technical Papers, pp. 57–58.
Kern et al "Fabrication and Analysis of Deep Submicron, etc . . . ", IEE Transactions on Electron Devices, vol. 47, No. 7 Jul. 2000, pp. 1406–1415.

* cited by examiner

*Primary Examiner*—John F. Niebling
*Assistant Examiner*—Stanetta Isaac
(74) *Attorney, Agent, or Firm*—Lee, Sterba & Morse, P.C.

(57) ABSTRACT

A method for forming SOI substrates including a SOI layer containing germanium and a strained silicon layer disposed on the SOI layer, comprises forming a relaxed silicon-germanium layer on a first silicon substrate using an epitaxial growth method, and forming a porous silicon-germanium layer thereon. A silicon-germanium epitaxial layer is formed on the porous silicon-germanium layer, an oxide layer is formed on a second silicon substrate, the second silicon substrate is bonded where the oxide layer is formed to the first silicon substrate where the silicon-germanium epitaxial layer is formed. Layers are removed to expose the silicon-germanium epitaxial layer and a strained silicon epitaxial layer is formed thereon. The porous silicon-germanium layer prevents lattice defects of the relaxed silicon-germanium layer from transferring to the silicon-germanium epitaxial layer. Therefore, it is possible to form the silicon-germanium layer and the strained silicon layer of the SOI layer without defects.

19 Claims, 6 Drawing Sheets

METHOD FOR FORMING SOI SUBSTRATE

BACKGROUND OF THE INVENTION

1. Field of the Invention

The present invention relates to a method for forming a SOI-type substrate. More particularly, the present invention relates to a method for forming a strained silicon layer on a Silicon-germanium On Insulator substrate (hereinafter referred to as "a SOI substrate").

2. Description of the Related Art

A SOI substrate is obtained by forming a buried oxide layer in a substrate to form a device isolation layer to completely isolate devices from each other. Due to its tolerance to radiation and ability to elevate a breakdown voltage, SOI substrates are mainly used to fabricate semiconductor devices such as high-performance processors.

In case that the SOI substrate includes a SOI layer composed of silicon-germanium and a silicon layer formed on the SOI layer, a difference in lattice constant between the silicon layer and the silicon-germanium layer renders a biaxial tension to the silicon layer. If the silicon layer is strained, electron carriers decrease in effective mass and scattering, and this causes an increase in mobility of the electron carriers in the silicon layer.

The prior art discloses conventional methods for improving performance of a circuit of a CMOS semiconductor device. The methods include forming a SOI layer composed of silicon-germanium, then forming a strained silicon layer on the SOI layer. Referring to FIG. 1, the conventional method includes stacking a graded silicon-germanium ($Si_xGe_{1-x}$) layer 13, a relaxed silicon-germanium ($Si_{1-y}Ge_y$) buffer layer 14, a phosphorus doped silicon-germanium ($Si_{1-y}Ge_y$) layer 15, a strained silicon (Si) channel layer 16, a strained silicon-germanium ($Si_{1-z}Ge_z$) channel layer 17, a relaxed silicon-germanium ($Si_yGe_{1-y}$) layer 18, and a silicon layer 19 on a first silicon substrate 12 using an epitaxial growth method.

Thereafter, a second silicon substrate 26 where an oxide layer 28 is formed is bonded to the first silicon substrate 12 where the silicon layer 19 is formed, such that top surfaces of the first and second silicon layers 12 and 26 are in contact with each other. Reference numeral 20 in FIG. 1 represents a contact surface between the first and second silicon substrates 12 and 26.

The first silicon substrate 12, the graded silicon-germanium layer 13, and the relaxed silicon-germanium buffer layer 14, are removed from the first silicon substrate 12 by using a high-temperature solution of potassium hydroxide. The phosphorus doped silicon-germanium layer 15 is oxidized by wet oxidation and then removed using fluoric acid.

As a result, the strained silicon channel layer 16 remains on top of the resultant structure including the two substrates bonded to each other. In this method, when the strained silicon channel layer 16 has a thickness of approximately 40 to 100 angstroms, both sides of the strained silicon channel layer 16 are in contact with the silicon-germanium layers 15 and 17, which are different from each other in lattice constant. Thus, lattice defects caused by interface misfit may be generated in the strained silicon channel layer 16. Furthermore, removing the phosphorus doped silicon-germanium layer 15 may adversely influence the quality of the strained silicon channel layer 16, where devices will be formed in subsequent processes.

Generally, if layers having different lattice constants are stacked to more than a certain thickness, pressure or tension applied to the layers is relaxed by generation of the lattice defects. However, if a silicon layer is stacked on the relaxed silicon-germanium layer using an epitaxial growth method, the quality of the silicon layer deteriorates due to lattice defects in the silicon-germanium layer. Consequently, semiconductor devices using the epitaxial silicon layer may suffer from poor operational characteristics.

In the event that a strained silicon layer is formed on a SOI substrate using a silicon-germanium layer, an increase in electron mobility affected by tension ceases when the germanium concentration is 10% or more, whereas hole mobility affected by tension continues to increase until the germanium concentration reaches 30%. Accordingly, to improve performance of devices, it is necessary to increase the germanium concentration of the silicon-germanium layer. Meanwhile, when a buried oxide layer is formed using separation by implanted oxygen (SIMOX), a high-temperature annealing should follow. However, as a germanium concentration increases, a melting point of a substrate decreases. Therefore, it undesirable to employ SIMOX when forming an SOI substrate using a silicon-germanium layer having a strained silicon layer.

A method as illustrated in FIGS. 2 to 5 may be used to form a SOI substrate that does not suffer from interface misfit. The SOI substrate includes a SOI layer of high germanium concentration having a strained silicon layer on its surface. According to the method, as illustrated in FIG. 2, a relaxed thick silicon-germanium layer 34 is formed on a first silicon substrate 32. Hydrogen ions are then doped into the first silicon substrate 32 including the relaxed thick silicon-germanium layer 34. The resultant structure is then annealed. Thus, lattice defects, which result from misfit interface 38 between the first silicon substrate 32 and the silicon-germanium layer 34, are cured around a surface 36 where a hydrogen concentration is high.

As illustrated in FIG. 3, after forming an oxide layer 48 on a second silicon substrate 46, the first and second silicon substrates 32 and 46 are bonded to each other. Reference numeral 50 in FIG. 3 represents a contact surface between the substrates 32 and 46.

As illustrated in FIG. 4, the whole bonded substrate is cut at the surface 36 where the hydrogen concentration is high. As a result, the second silicon substrate 46 including a silicon oxide layer 48 and the relaxed silicon-germanium layer 34 is separated from the first silicon substrate 32. In this case, lattice defects in the silicon-germanium layer 34 may be partially cured by the high hydrogen concentration at the cut surface 36.

As illustrated in FIG. 5, a silicon layer is thinly formed on the cut surface using an epitaxial growth method. Thus, a strained silicon layer 52 is formed on the silicon-germanium layer 34

However, in this method, the silicon-germanium layer 34 disposed under the strained silicon layer 52 may suffer from lattice defects during the hydrogen ion implantation process. As a result, hydrogen may not properly cure lattice defects of the relaxed silicon-germanium layer.

SUMMARY OF THE INVENTION

In order to solve the aforementioned problems, it is a feature of an embodiment of the present invention to provide methods for forming SOI substrates including a SOI layer containing germanium and a strained silicon layer disposed on the SOI layer.

It is another feature of an embodiment of the present invention to provide methods for forming SOI substrates including forming a strained silicon layer on a SOI layer, which contains a high-concentration of germanium and exhibits low lattice defects, in order to exhibit device characteristics of high carrier mobility.

In accordance with a feature of an embodiment of the present invention, a method for forming a SOI substrate includes forming a relaxed silicon-germanium layer on a first silicon substrate using an epitaxial growth method, forming a porous silicon-germanium layer on the first silicon substrate including the relaxed silicon-germanium layer, forming a silicon-germanium epitaxial layer on the porous silicon-germanium layer, forming an oxide layer on a second silicon substrate, bonding the second silicon substrate where the oxide layer is formed to the first silicon substrate where the silicon-germanium epitaxial layer is formed, so as to be in contact with each other, removing the first silicon substrate, the relaxed silicon-germanium layer, and the porous silicon-germanium layer to expose the silicon-germanium epitaxial layer, and forming a strained silicon epitaxial layer on the exposed silicon-germanium epitaxial layer.

In this case, the porous silicon-germanium layer prevents lattice defects of the relaxed silicon-germanium layer from transferring to the silicon-germanium epitaxial layer. As a result, the silicon-germanium epitaxial layer does not suffer from the lattice defects. This makes it possible to form the silicon-germanium layer and the strained silicon layer of the SOI layer without defects.

In the present invention, the porous silicon-germanium layer may be formed by anodization with respect to the relaxed silicon-germanium layer, which is well known to those skilled in the art. A technique for making a surface of a silicon substrate porous by anodization is taught in the prior art. Specifically, a front side of a substrate is placed in contact with a fluoric acid based solution, a negative electrode is set in the solution, and a positive electrode is set on a backside of the substrate. In the present invention, a voltage is applied to an electrode to pass electric currents through the substrate, causing oxidation of the relaxed silicon-germanium layer on the front side of the substrate. While the oxidized layer is etched by fluoric acid and removed, the relaxed silicon-germanium layer is changed to a porous silicon-germanium layer, having a crystal structure that is less dense than that of the relaxed silicon-germanium layer.

In the present invention, unlike SIMOX, the substrate is not subject to annealing at high temperatures so as to form a SOI substrate. Therefore, a content of germanium contained in the SOI layer may be increased to more than 15%. Thus, a silicon-germanium SOI layer containing germanium of 15% to 30% may be formed.

In the present invention, the epitaxial growth forming the relaxed silicon-germanium layer, the silicon-germanium epitaxial layer, and the strained silicon layer, is preferably carried out by low-pressure CVD, and may be carried out by atmospheric pressure thermal CVD, plasma CVD, molecular beam epitaxy, or sputtering.

The relaxed silicon-germanium layer formed on a silicon substrate is preferably a multiple layer so as to prevent an influence of crystal defects. For example, instead of forming the relaxed silicon-germanium layer to contain the uniform amount of germanium through one processing step, the relaxed silicon-germanium layer of the present invention may be formed through a plurality of process steps so as to minimize crystal defects, i.e., stacking multiple layers through 2 to 4 processing steps. Each layer of the relaxed silicon-germanium layer may contain a different amount of germanium from the other layers or the same amount of germanium as the other layers. A thickness of each layer ranges approximately from 100 to 2000 nm.

The silicon-germanium epitaxial layer may be exposed by removing the first silicon substrate and the relaxed silicon-germanium layer to expose the porous silicon layer, and selectively removing the exposed porous silicon layer. An over-etching may be performed such that a top surface of the silicon-germanium epitaxial layer is recessed. After exposing the silicon-germanium epitaxial layer, a surface of the exposed silicon-germanium epitaxial layer may be annealed in a hydrogen ambient to improve a surface morphology thereof. Further, the porous silicon layer may be exposed by cutting the porous silicon layer using water jet cutting.

The present invention provides methods of forming SOI substrates including forming a strained silicon layer on a SOI layer, which contains a high-concentration of germanium and exhibits low lattice defects, so that semiconductor devices utilizing the SOI substrate formed by the methods of the present invention may exhibit improved operational characteristics due to increased carrier mobility.

These and other features and advantages of the present invention will be readily apparent to those of ordinary skill in the art upon review of the detailed description that follows.

DETAILED DESCRIPTION OF THE INVENTION

Figure 1:
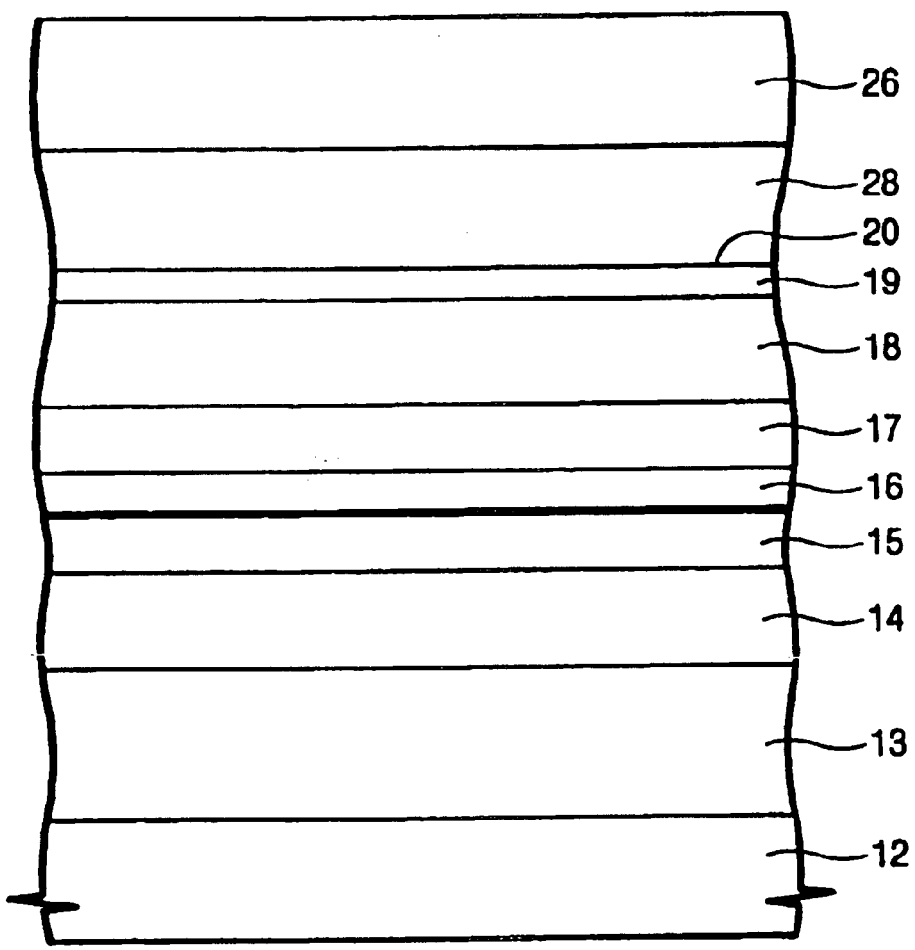
FIG. 1 illustrates a cross-sectional view of an example of a conventional method of forming a SOI substrate.
Figure 2:
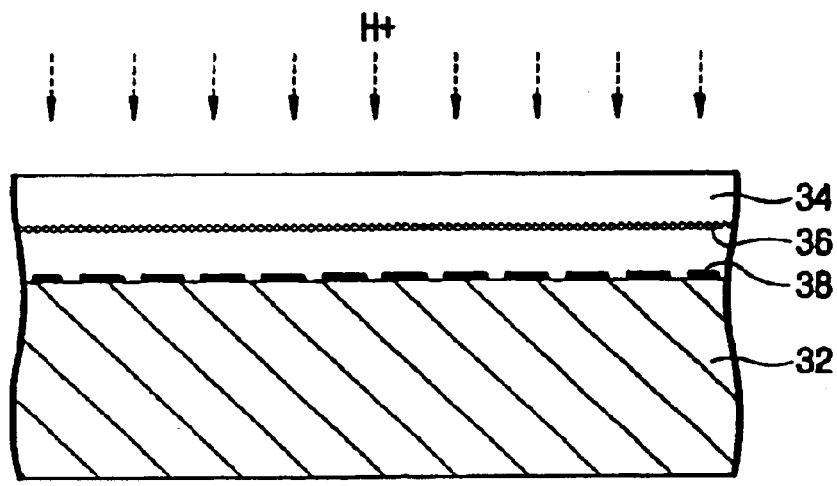
FIGS. 2 to 5 illustrate cross-sectional views of a transformed example of a conventional method of forming a SOI substrate.
Figure 3:
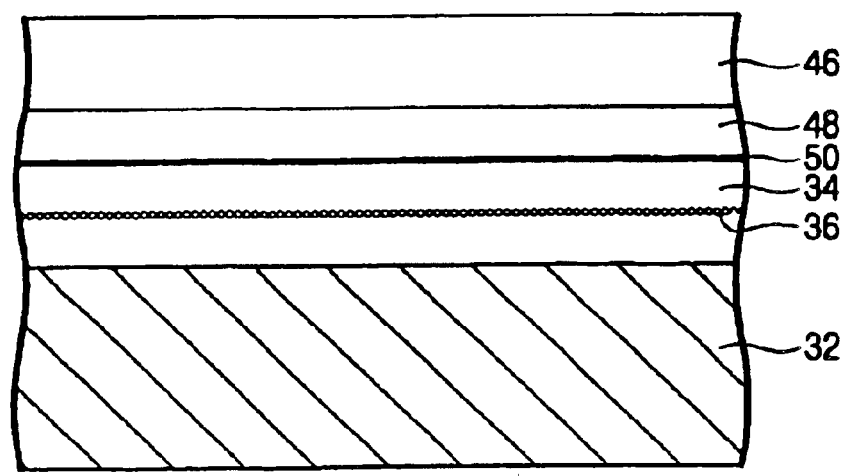
Figure 4:
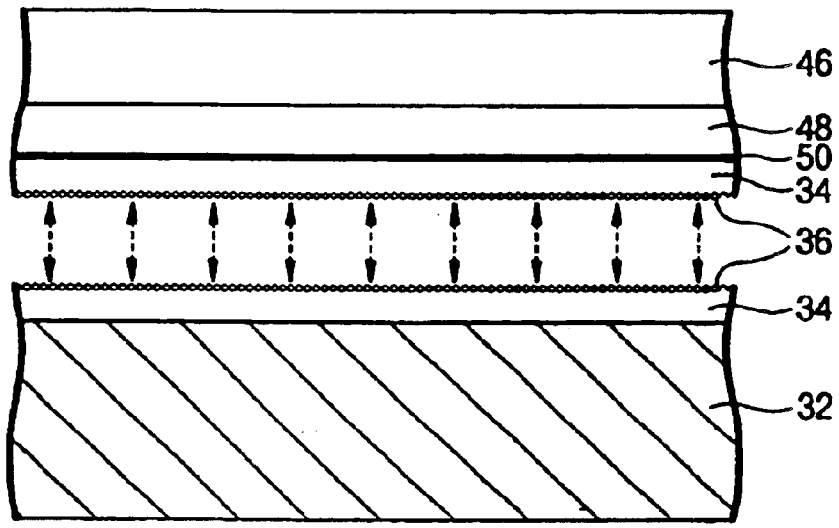
Figure 5:
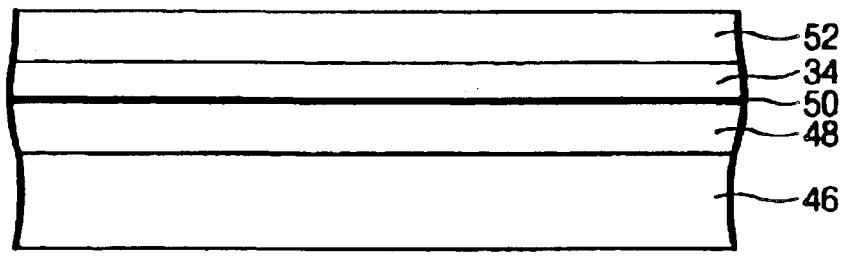

This application relies for priority upon Korean Patent Application No. 2001-75864, filed on Dec. 3, 2001, "Method For Forming SOI Substrate," the contents of which are incorporated herein by reference in their entirety.

The present invention will now be described more fully with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 6:
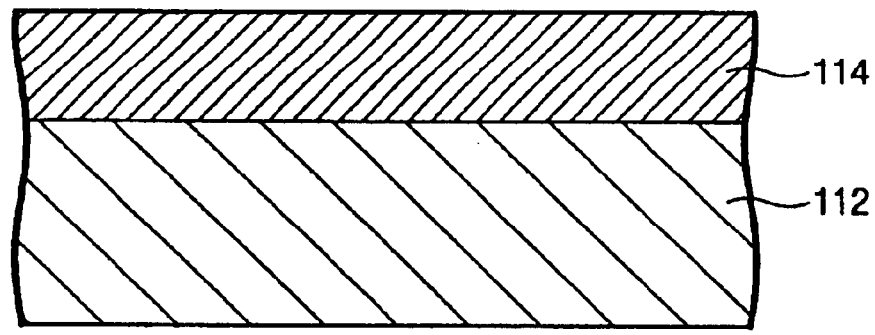
FIGS. 6 to 12 illustrate cross-sectional views of an example of a method of forming a SOI substrate according to an embodiment of the present invention.

Referring to FIG. 6, a relaxed silicon-germanium layer 114 is epitaxially grown over a first silicon substrate 112. An interface misfit arises due to a difference in lattice constant between the silicon substrate 112 and the relaxed silicon-germanium layer 114, which causes stress to the silicon-germanium layer. Also, when a thickness of the silicon-germanium layer is more than a critical thickness, crystal defects such as dislocation are generated to alleviate the stress. The layer where the crystal defects are generated becomes the relaxed silicon-germanium layer 114.

The present invention provides the relaxed silicon-germanium layer 114, which is formed by stacking multiple layers through multiple processing steps. At this time, each layer may contain a different amount of germanium than the other layers, or the same amount of germanium as other layers. Interfaces between the layers for forming the relaxed silicon-germanium layer 114 are used as barriers for preventing propagation of crystal defects. A thickness of the relaxed silicon-germanium layer 114 may range from several thousands to tens of thousands of angstroms.

Figure 7:
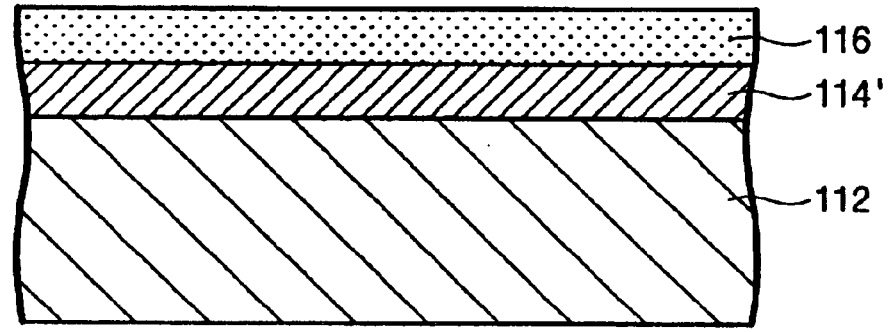

Referring to FIGS. 6 and 7, anodization is carried out to a surface of the substrate where the relaxed silicon-germanium layer 114 is formed. For anodization, a front side of the substrate where the relaxed silicon-germanium layer 114 is formed is in contact with a first solution in which a negative electrode is placed, and a back side of the substrate is either in direct contact with a positive electrode or connected to the positive electrode through a second solution. The first solution contains fluoric acid diluted by deionized water, and a depolarizer may be added to the first solution to prevent polarization caused by rising air bubbles.

A voltage is applied to an electrode to pass electric currents through the substrate, thereby causing oxidation of the relaxed silicon-germanium layer 114 on the front side of the substrate. While the oxidized layer is etched by fluoric acid and removed, the relaxed silicon-germanium layer 114 is changed to a porous silicon-germanium layer 116, having a crystal structure that is less dense than that of the relaxed silicon-germanium layer. A remnant 114' of the relaxed silicon-germanium layer remains.

The porous silicon-germanium layer 116 is formed on the surface of the first substrate by anodization to a thickness of several thousands of angstroms. During the anodization, a concentration of fluoric acid and the amount of current passing through the electrodes may be controlled. This makes it possible to control oxidation and removal of the porous silicon-germanium layer 116.

Figure 8:
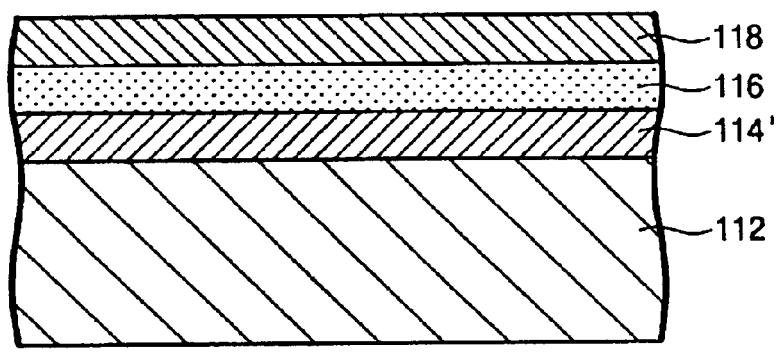

Referring to FIG. 8, a silicon-germanium epitaxial layer 118 is formed on the porous silicon-germanium layer 116 to a thickness of several thousands of angstroms. However, as semiconductor devices become more highly integrated, their magnitudes decrease. As a result, a thickness of the silicon-germanium epitaxial layer 118, which corresponds to a thickness of a SOI layer, may also be reduced to about 500 angstroms. The silicon-germanium epitaxial layer 118 is formed to have a crystal structure that does not suffer from crystal defects, and to contain a germanium concentration of approximately 15% to 30%.

Figure 9:
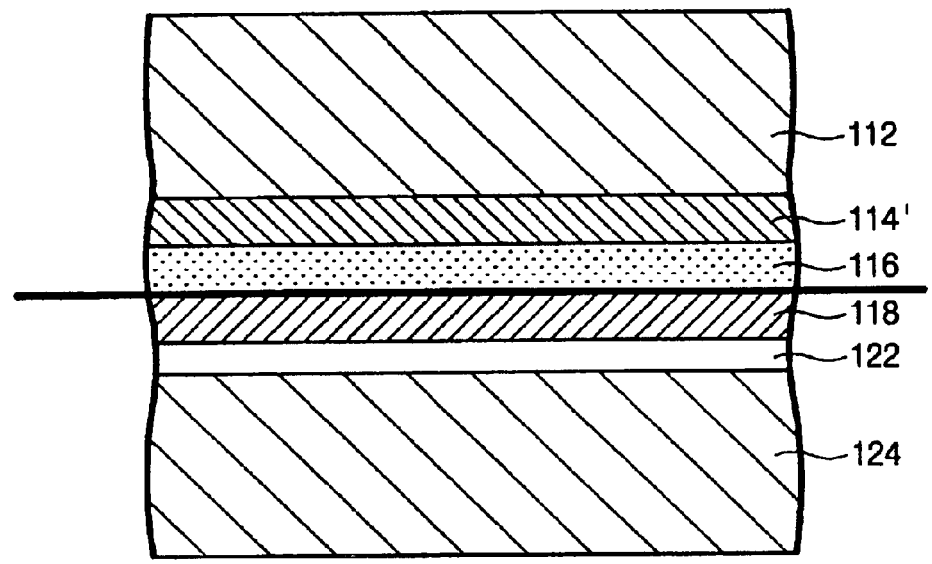

Referring to FIG. 9, a second silicon substrate 124 is prepared. A surface of the second silicon substrate 124 is oxidized to form a silicon oxide layer 122. Continuously, the second silicon substrate 124 where the silicon oxide layer 122 is formed is bonded to the first silicon substrate 112 where the silicon-germanium epitaxial layer 118 is formed, such that the silicon oxide layer 122 and the silicon-germanium epitaxial layer 118 are in contact with each other. To reinforce adhesion to each other, a portion of the silicon-germanium epitaxial layer 118 formed on the first silicon substrate 112 may be oxidized. This enables the first and second silicon substrates 112 and 124 to be easily bonded.

Figure 10:
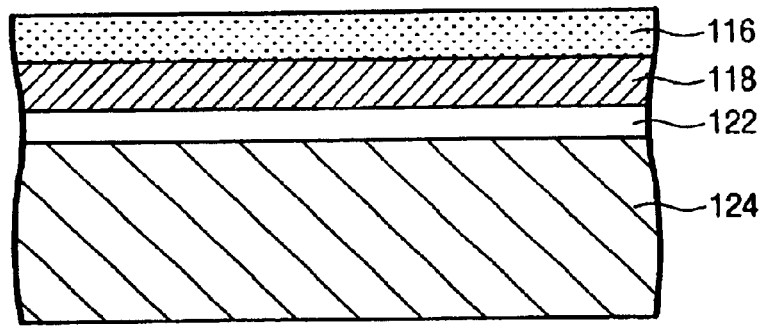

As illustrated in FIG. 10, the first silicon substrate 112 and the remnant 114' of the relaxed silicon-germanium layer are removed. The first silicon substrate 112 may be removed using CMP or an etchback process. In this case, the porous silicon-germanium layer 116 may be used as an etch stop layer. The removing process may be conducted by water jet cutting. Water jet cutting enables horizontal separation of the porous silicon-germanium layer 116. Thus, the first silicon substrate 112, the remnant 114' of the relaxed silicon-germanium layer and the porous silicon-germanium layer 116 may be withdrawn without damage and used in other steps of FIGS. 6 and 7.

Figure 11:
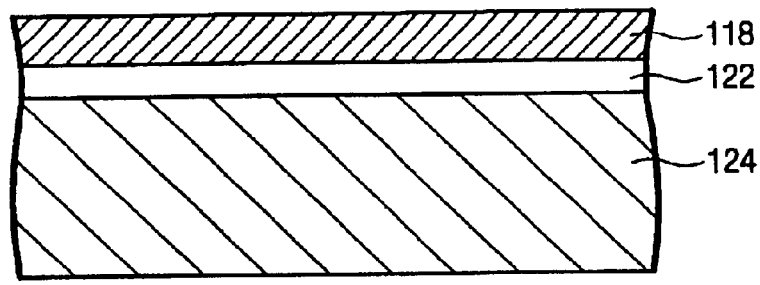

Referring to FIGS. 10 and 11, the porous silicon-germanium layer 116 over the second silicon substrate 124 is selectively removed to expose the silicon-germanium epitaxial layer 118. The selective removing process preferably employs a wet etching process having an etch selectivity with respect to the silicon-germanium epitaxial layer 118. An upper portion of the silicon-germanium epitaxial layer 118 is preferably removed using an over-etching so as to remove crystal defects generated when the silicon-germanium epitaxial layer 118 is formed. Also, a surface of the silicon-germanium epitaxial layer 118 may be annealed in a hydrogen ambient to improve a surface morphology thereof.

Figure 12:
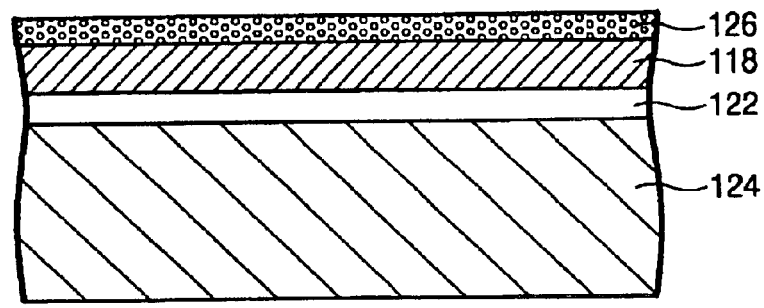

Referring to FIG. 12, a silicon layer 126 is formed on the silicon-germanium epitaxial layer 118 to a thickness of approximately 50 to 500 angstroms. Preferably, the silicon layer 126 is thinly formed to a thickness of 200 angstroms or less. Because of lattice constant between the silicon layer 126 and the silicon-germanium epitaxial layer 118, the silicon layer 126 is formed to be strained. This can increase mobility of carriers in the silicon layer 126.

According to the present invention, forming a SOI substrate where a strained silicon layer is disposed on a SOI layer containing germanium allows mobility of carriers in the silicon layer to increase. Also, CMOS semiconductor devices formed at the SOI substrate may have improved characteristics and efficiency.

What is claimed is:

1. A method for forming a SOI substrate comprising:
    forming a relaxed silicon-germanium layer on a first silicon substrate using an epitaxial growth method;
    forming a porous silicon-germanium layer on the first silicon substrate including the relaxed silicon-germanium layer;
    forming a silicon-germanium epitaxial layer on the porous silicon-germanium layer;
    forming an oxide layer on a second silicon substrate;
    bonding the second silicon substrate where the oxide layer is formed to the first silicon substrate where the silicon-germanium epitaxial layer is formed to be in contact with each other;
    removing the first silicon substrate, the relaxed silicon-germanium layer, and the porous silicon-germanium layer to expose the silicon-germanium epitaxial layer; and
    forming a strained silicon-epitaxial layer on the silicon-germanium epitaxial layer.

2. The method as claimed in claim 1, wherein the porous silicon-germanium layer is formed by anodization with respect to the relaxed silicon-germanium layer.

3. The method as claimed in claim 2, wherein the porous silicon-germanium layer is formed to a thickness of several thousand angstroms.

4. The method as claimed in claim 2, wherein a remnant of the relaxed silicon-germanium layer remains after anodization.

5. The method as claimed in claim 1, wherein a content of germanium contained in the silicon-germanium epitaxial layer ranges from 15% to 30%.

6. The method as claimed in claim 1, wherein a thickness of the silicon-germanium epitaxial layer ranges from about 500 angstroms to several thousand angstroms.

7. The method as claimed in claim 1, wherein the relaxed silicon-germanium layer, the silicon-germanium epitaxial layer, and the strained silicon layer are formed by using one method selected from the group consisting of low-pressure CVD, atmospheric pressure thermal CVD, plasma CVD, molecular beam epitaxy, and sputtering.

8. The method as claimed in claim 1, wherein the relaxed silicon-germanium layer is formed through a plurality of process steps so as to minimize crystal defects.

9. The method as claimed in claim 8, wherein the plurality of process steps includes stacking multiple layers containing germanium to form the relaxed silicon-germanium layer on the silicon substrate to be a multiple layer.

10. The method as claimed in claim 9, wherein each layer of the relaxed silicon-germanium layer is formed to a thickness of from approximately 100 to 2000 nm.

11. The method as claimed in claim 1, wherein exposing the silicon-germanium epitaxial layer comprises:

removing the first silicon substrate and the relaxed silicon-germanium layer to expose the porous silicon layer; and selectively removing the exposed porous silicon layer.

12. The method as claimed in claim 11, wherein exposing the porous silicon layer comprises cutting the porous silicon layer using water jet cutting.

13. The method as claimed in claim 11, wherein selectively removing the exposed porous silicon layer employs a wet etching process having an etch selectivity with respect to the silicon-germanium epitaxial layer.

14. The method as claimed in claim 1, wherein exposing the silicon-germanium epitaxial layer comprises performing an over-etching such that a top surface of the silicon-germanium epitaxial layer is recessed.

15. The method as claimed in claim 1, wherein removing the first silicon substrate is performed by using CMP or an etchback process, and using the porous silicon-germanium layer as an etch stop layer.

16. The method as claimed in claim 1, further comprising annealing a surface of the exposed silicon-germanium epitaxial layer in a hydrogen ambient, after exposing the silicon-germanium epitaxial layer.

17. The method as claimed in claim 1, wherein a portion of the silicon-germanium epitaxial layer fanned on the first silicon substrate is oxidized to allow the first and second silicon substrates to be easily bonded.

18. The method as claimed in claim 1, wherein the strained silicon-epitaxial layer is formed to a thickness of approximately 50 to 500 angstroms.

19. The method as claimed in claim 1, wherein the strained silicon-epitaxial layer is formed to a thickness of 200 angstroms or less.

* * * * *